United States Patent [19]

Frauenglass

[11] Patent Number: 4,912,734
[45] Date of Patent: Mar. 27, 1990

[54] HIGH RESOLUTION EVENT OCCURRANCE TIME COUNTER

[75] Inventor: Richard M. Frauenglass, Holbrook, N.Y.

[73] Assignee: Ail Systems, Inc., Deer Park, N.Y.

[21] Appl. No.: 310,766

[22] Filed: Feb. 14, 1989

[51] Int. Cl.[4] .............................................. H03L 7/00
[52] U.S. Cl. ...................................... 377/20; 377/44; 328/72; 375/110
[58] Field of Search ............... 377/43, 44, 20; 328/72; 375/118, 110

[56] References Cited

U.S. PATENT DOCUMENTS

| 4,307,449 | 12/1981 | Strubin | 377/20 |
| 4,352,195 | 9/1982 | Dautremay et al. | 328/72 |
| 4,764,694 | 8/1988 | Winroth | 377/20 |

Primary Examiner—John S. Heyman
Attorney, Agent, or Firm—Hoffman & Baron

[57] ABSTRACT

A high resolution event occurrence time counter includes a free running counter which is responsive to a clock signal and which provides count data that varies in response to the clock signal. A first register stores the count data of the free running counter. The first register provides first register data representative of the count data stored in the register. A second register stores the first register data and provides first time of arrival data representative of the first register data stored in the second register. A third register stores the count data of the free running counter. The third register provides second time of arrival data representative of the count data which is stored in the third register. A clock edge encoder determines whether an event occurred during the first half cycle of the clock signal or during the second half cycle. The clock edge encoder provides a first sync signal when the event occurred during the first half cycle, and a second sync signal when the event occurred during the second half cycle. The second register stores the first register data in response to the first sync signal, and the third register stores the count data in response to the second sync signal. Either the first time of arrival data or the second time of arrival data, depending on whether the first or second sync signal is generated, is provided as output time of arrival data of the event occurrence time counter.

7 Claims, 7 Drawing Sheets

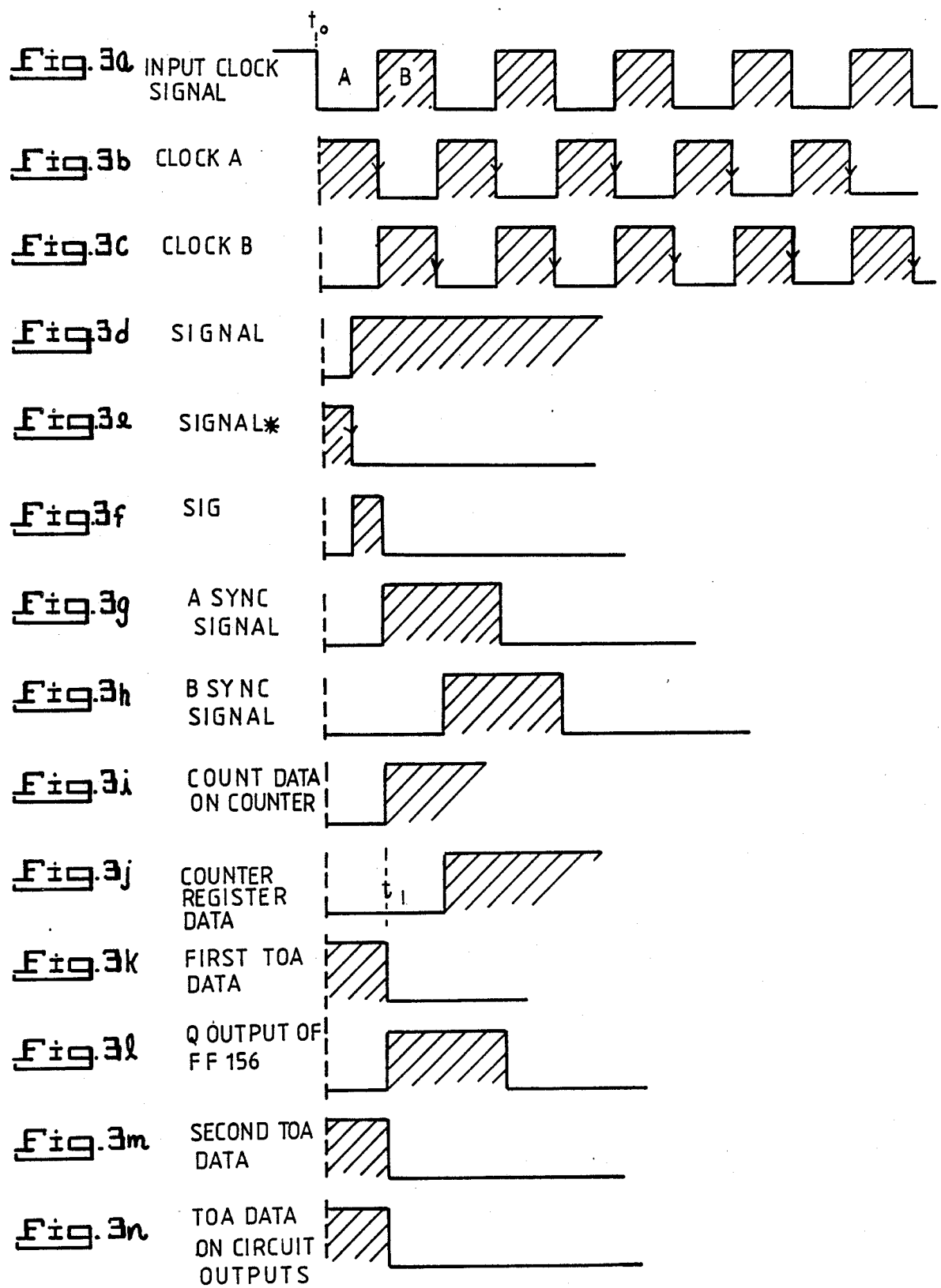

4,912,734

HIGH RESOLUTION EVENT OCCURRANCE TIME COUNTER

BACKGROUND OF THE INVENTION

1. Field of the Invention

The invention relates to a time of arrival encoder, and more particularly relates to a high resolution event occurrence time counter useful in applications where high precision time interval measurements are necessary.

2. Objects and Summary of the Invention

It is an object of the present invention to provide an event occurrence time counter which provides a high resolution time interval measurement.

It is another object of the present invention to provide an event occurrence time counter adapted for use at clock frequencies in the Gigahertz range.

It is yet another object of the present invention to provide a event occurrence time counter circuit which is adapted to measure the interval of time following the occurrence of an event to within an accuracy of one-half the clock period.

It is yet a further object of the present invention to provide an event occurrence time counter which provides time interval measurement data with minimal ambiguity.

It is yet a further object of the present invention to provide a positive means to assure that a particular type of counter, i.e., a Johnson type counter, will operate properly without the necessity for an external reset which, if improperly applied, can cause improper operation of the counter. Said means assures proper sequence after as many clocks as there are stages in the counter and assures operation for all cycles thereafter and a recovery in the event of a clock anomaly.

It is yet a further object of the present invention to provide an implementation which requires no alignments or adjustments either initially or upon replacement of any of its constituent elements and remains impervious to physical and temperature effects, providing implementation constraints are satisfied.

In accordance with one form of the present invention, a high resolution event occurrence time counter includes a free running counter which is responsive to a clock signal, such as a periodic logic signal having a frequency on the order of a Gigahertz or more. The counter provides a count data of binary form, which data varies in response to the clock signal.

The event occurrence time counter further includes a first register which stores the count data of the free running counter in response to the clock signal or, more specifically, its inverse. The count data is stored in the first register at least one-half period after the count data has changed in the counter in response to the leading edge of the clock signal. The first register provides first register data which represents the count data stored in the first register.

A second register stores the first register data, and provides first time of arrival data representative of the first register data.

A third register stores the count data of the free running counter, and provides second time of arrival data representative of the count data that is stored in the third register.

The event occurrence time counter further includes a clock edge encoder. The clock edge encoder determines whether an event has occurred during either the first half period of the clock signal or the second half period. The clock edge encoder provides a first sync signal when the event occurred during the first half period, and a second sync signal when the event occurred during the second half period.

The second register stores the first register data in response to the first sync signal, and the third register stores the count data of the counter in response to the second sync signal.

Depending on when the event occurred, that is, either in the first half period of the clock signal or in the second half period, at least the first time of arrival data or at least the second time of arrival data is provided as output data of the event occurrence time counter.

Basically, the event occurrence time counter works in the following manner. The counter and first register are clocked on opposite edges of the input clock signal. Depending upon during which half period of the clock signal an event occurs, the event occurrence time counter will provide output data which is the more stable of the count data of the counter or the first register data of the first register.

The counter is updated (i.e., clocked) at the mid-point of each period of the clock signal, that is, directly after the first half period. If the event occurs within the first half period of the clock signal, the counter may not have fully stabilized and the count data may be ambiguous.

However, the first register has the count data of a previous clock period stored in it, which data is assured of being stable because the count data is clocked into the first register at the end of each clock period (i.e., after the second half period). In other words, the count data has had sufficient time to settle out so that the data is not in a transition phase when it is clocked into the first register.

Accordingly, if the event occurs in the first half period of the clock signal, the event occurrence time counter will output the more stable data, which is the count data from the previous period or cycle stored in the first register. This first register data is stored in the second register upon generation of a first sync signal and is chosen as the time of arrival output data by the event occurrence time counter.

If the event occurs in the second half period of the clock signal, the more stable and accurate of the first register data and the count data is the count data. This is because the first register data may be changing, as the count data is being loaded into the first register at the end of the second half cycle of clock signal and the first register data may be in a transition phase. The counter, on the other hand, has stabilized by the end of the second half period, and its count data is unambiguous. The stable count data is stored in the third register upon generation of a second sync signal (indicating that the event occurred in the second half clock period) and is chosen as the time of arrival output data by the event occurrence time counter.

The clock edge encoder will determine which data the event occurrence time counter should output, that is, either the first time of arrival data of the second register representing the first register data (which is, in effect, the count data of the previous cycle), or the second time of arrival data of the third register representing the count data for the present cycle. Because the clock edge encoder determines in which half cycle the event occurred, and chooses the output data of the event occurrence time counter accordingly, an indication of the half cycle in which the event occurred is known and is provided as the least significant bit of the output data.

These and other objects, features and advantages of the present invention will be apparent from the following detailed description of illustrative embodiments thereof, which is to be read in connection with the accompanying drawings.

BRIEF DESCRIPTION OF THE DRAWINGS

FIGS. 3a through 3n are timing diagrams illustrating the signals generated by the circuit shown in FIGS. 2a through 2e.

DETAILED DESCRIPTION OF THE PREFERRED EMBODIMENTS

Figure 1:
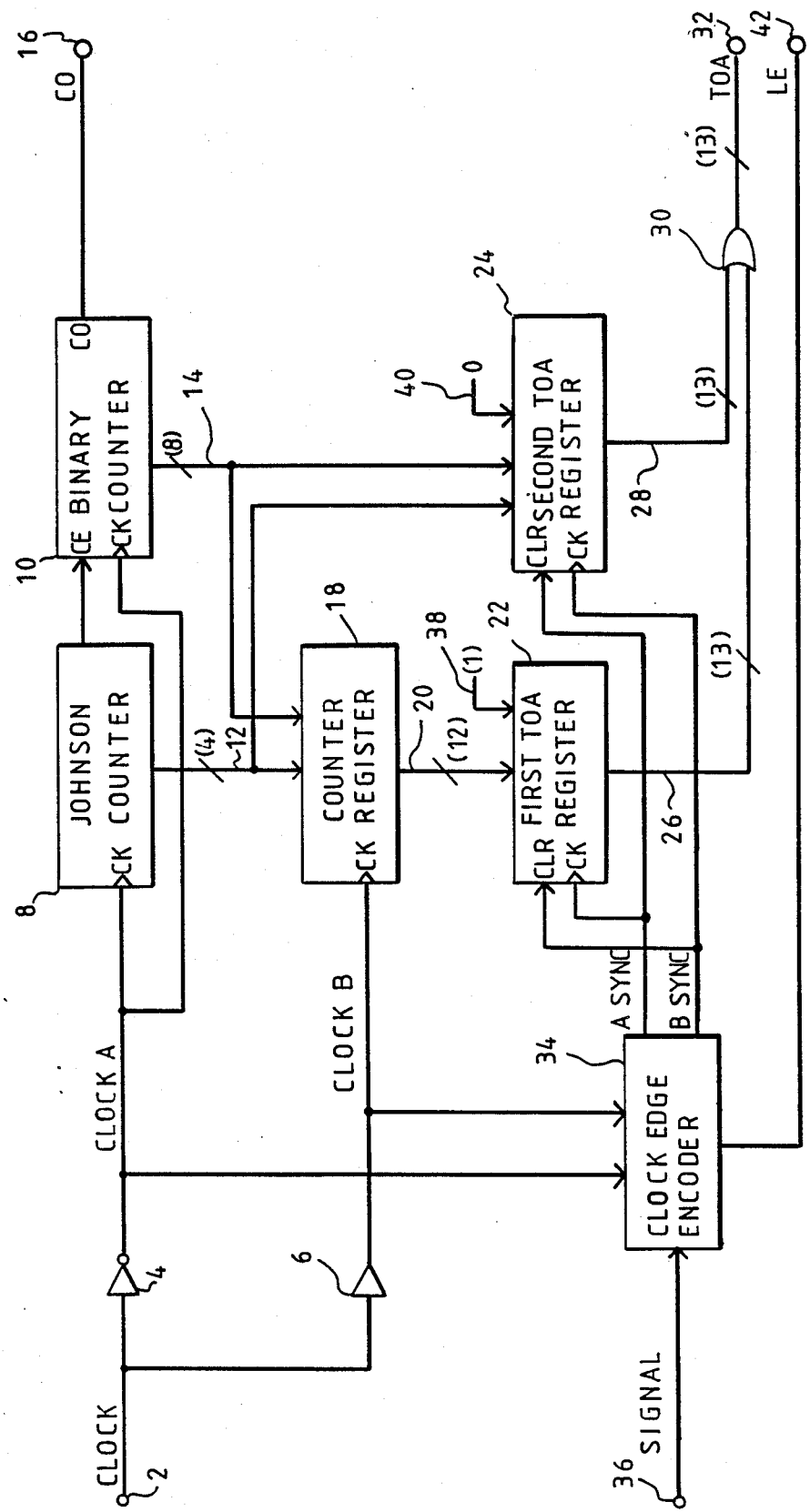
FIG. 1 is a block diagram of one form of a high resolution event occurrence time counter formed in accordance with the present invention.

FIG. 1 shows a block diagram of one form of a high resolution event occurrence time counter formed in accordance with the present invention, and preferably in the form of a circuit. A clock signal is provided to the event occurrence time counter on input 2 from an external source. The clock signal is preferably periodic and has a 50% duty cycle, and has a logic level amplitude so as to be compatible with the components of the circuit. The circuit of the present invention is perfectly adapted to accept, and operate with, a clock signal of very high frequency such as in the Gigahertz range, for example 2 GHZ, although clock signals of lower frequencies may suitably be used.

The input clock signal is provided to an inverter 4 and to a non-inverting buffer 6, and, to facilitate an understanding of the invention, the output signals of the inverter 4 and buffer 6 are respectively referred to as Clock A and Clock B.

The Clock A signal is provided to the clock (CK) input of a counter preferably comprising a 4 bit Johnson-type counter 8 and an 8 bit binary counter 10. Counters 8 and 10 are free running and change state with the Clock A signal.

A Johnson counter 8 constitutes the lower significant bit stage of the counter and is preferred, although not required under all circumstances, because of its embodied self-clearing nature and because only one of its outputs at a time changes state in response to Clock A and because it is able to operate at a speed faster than that obtainable with counters of a binary sequence nature. Johnson counter 8 is used only if a synchronous counter cannot be clocked at the required rate.

The binary counter 10 is connected in series with the Johnson counter 8 and as the more significant bit stage of the overall counter.

The free running counter comprising the Johnson counter 8 and the binary counter 10 will provide count data on multiple lines 12 and 14, respectively, which count data will vary in response to Clock A. Four bits of count data will be provided by the Johnson counter 8, and 8 bits of count data will be provided by the binary counter 10, although it is envisioned that greater or fewer bits of count data may be provided by each. Thus, the count data from the overall free running counter is preferably a 12 bit word. However, a CARRY OUTPUT (CO) signal is provided on output 16 of the circuit for connection to an external counter (not shown), if desired. The CARRY OUTPUT signal may be used to clock the external counter and provides synchronization with the counters used in the circuit of the invention described herein. As will be seen, the signal is at a high logic level whenever the four upper (most significant) bits of the binary counter 10 are high, and it has a pulse width of 128 clock periods.

The count data from Johnson counter 8 and binary counter 10 is provided to a first register, referred to in FIG. 1 as counter register 18. The Clock B signal is provided to the clock (CK) input of the counter register 18, and the count data from counters 8, 10 is stored in counter register 18 in response to the Clock B signal. Counter register 18 provides counter register data (also referred to as "first register data") on multiple line 20, which data is representative of the count data stored in the register.

The event occurrence time counter also includes a second and a third register, referred to in FIG. 1 as the first TOA register 22 and second TOA register 24, respectively, "TOA" referring to "time of arrival". The first TOA register 22 receives the counter register data provided on line 20 and stores that data upon the generation of a first predetermined signal, A SYNC, which signal is provided to the clock (CK) input of register 22, as will be explained. Similarly, the second TOA register 24 receives the count data provided on lines 12 and 14 and stores that data upon the generation of a second predetermined signal, B SYNC, which signal is provided to the clock (CK) input of register 24.

The first and second TOA registers 22, 24 respectively provide first and second time of arrival data on multiple lines 26 and 28, respectively. The TOA data of each register 22, 24 comprises a 13 bit word, 12 of which correspond to the count data derived by counters 8, 10, and one additional bit which comprises the least significant bit of the TOA data.

Corresponding weight bits of the first and second TOA data are logic or'ed together using a series of OR gates, designated generally by reference numeral 30 in FIG. 1. The output signals of the OR gates 30 are provided to multiple output 32 of the event occurrence time counter circuit as TOA output data.

It should be noted that only the first TOA data or the second TOA data, and not both, will be present on the OR gates 30 when the TOA data is ready to be read out on the circuit output 32. When the A SYNC signal clocks the counter register data on line 20 into the first TOA register 22, it will also clear the second TOA register 24 of stored count data, as the A SYNC signal is also provided to the clear (CLR) input of register 24. Similarly, when the B SYNC signal is generated, it will not only clock the count data on lines 12 and 14 into the second TOA register 24, but it will also clear the first TOA register 22 of its stored counter register data, as the B SYNC signal is also provided to the clear (CLR) input of register 22.

The event occurrence time counter also includes a clock edge encoder 34, as shown in FIG. 1. The clock edge encoder 34 generates the A SYNC and B SYNC signals and, thus, controls which of the first and second TOA data is to be provided as TOA output data on the circuit's output 32.

Upon the occurrence of an event, an input signal is received on input 36 of the circuit. The input signal is provided to the clock edge encoder 34. Also provided to the clock edge encoder are the CLOCK A and CLOCK B signals.

If the input signal arrives (and, accordingly, the event occurs) during the first half cycle of the clock signal on input 2, the clock edge encoder will generate the A SYNC signal. Because of actual circuit propagation delays, it is possible that both A SYNC and B SYNC signals will be generated if the input signal arrives during the first half clock cycle; however, in such a case, the A SYNC signal will always be generated first in time, with the B SYNC signal lagging, and only the A SYNC signal will be effective in controlling the rest of the circuit, as if only the A SYNC signal had been generated. The A SYNC signal will load the counter register data into the first TOA register 22 and will clear the second TOA register 24. Thus, upon generation of at least the A SYNC signal, indicating that an event has occurred during the first half cycle of the input clock, the counter register data stored in the first TOA register 22, which data is, in effect, the count data from the previous clock cycle, is provided as TOA output data by the circuit on output 32.

Analogously, if the event occurs during the second half cycle of the input clock signal such that the signal on input 36 is received during the second half cycle, the clock edge encoder 34 will generate the B SYNC signal. Again, because of propagation delays, it is possible that B SYNC and A SYNC signals are generated, with the B SYNC first in time and the A SYNC lagging. In such a case, the first in time signal, B SYNC, will control the circuit.

The B SYNC signal will load the count data into the second TOA register 24 and will clear the first TOA register 22. Therefore, upon generation of the B SYNC signal, indicating that an event has occurred during the second half cycle of the input clock, the count data stored in the second TOA register 24, which is the count data of the particular cycle of the input clock during which the event occurred, is provided as TOA output data by the circuit on output 32.

The purpose in selecting either the previous cycle's count data stored in counter register 18 and inputted to the first TOA register 22 as counter register data, or the present cycle's count data stored in the second TOA register 24, is to ensure that only stable, unambiguous count data is provided by the circuit as TOA data. If the event occurs during the first half cycle of the input clock, the count data is updated mid-cycle, as the counters 8, 10 are clocked on the input clock's edge directly following the first half cycle. The count data may be in transition and, accordingly, sufficient time is needed, for example, a half clock period, for the count data to settle before it is loaded into counter register 18, which loading occurs at the end of the second half cycle of the clock. Accordingly, the count data of the cycle during which the event occurred is not chosen by the circuit to be outputted as TOA data, but rather the previous cycle's count data already stored in counter register 18, which data is assured of being stable.

Similarly, if the event occurs during the second half cycle of the input clock, the count data for the present cycle, and not the counter register data of counter register 18, will be the more stable of the two, as the counter register data will change at the end of the second half cycle. The present count data thus is provided by the circuit as TOA output data.

The TOA data provided on output 32 of the circuit comprises a 13 bit word. The first 12 bits represent count data, and the 13th and least significant bit represents the particular half cycle of the clock signal during which the event occurred. If the event occurred during the first half cycle, the A SYNC signal will be generated and the first TOA data from the first TOA register 22 will be provided through OR gate 30 to output 32. A logic "1" level on line 38 is provided to and is loaded into the first TOA register 22 as the least significant bit of the first TOA data. Accordingly, if the event occurred in the first half clock cycle, a logic "1" will appear in the least significant bit place on output 32.

If the event occurred in the second half cycle of the input clock, then a B SYNC signal is generated. The 12 bit count data from counters 8, 10 is loaded into the second TOA register 24, along with a logic "0" level provided to the register 24 on line 40, as the 13th and least significant bit of TOA data. Thus, a logic "0" level will appear in the least significant bit place on output 32 if the event occurred in the second half cycle of the clock signal. From this it can be seen that the resolution provided by the event occurrence time counter is equal to 0.5 of the clock period.

The clock edge encoder 34 also provides a LATCH ENABLE (LE) signal on output 42. The LATCH ENABLE signal is generated at a predetermined time interval after the input signal is received, the predetermined time interval being selected to be at least equal to or greater than the propagation delay times of the various circuit components. The LATCH ENABLE signal indicates to an external circuit when the TOA data on output 32 is available to be read by or latched in registers of the external circuit.

FIGS. 2a–2e are schematic circuit diagrams of interconnected portions of the event occurrence time counter shown in block diagram form in FIG. 1.

Figure 2A:
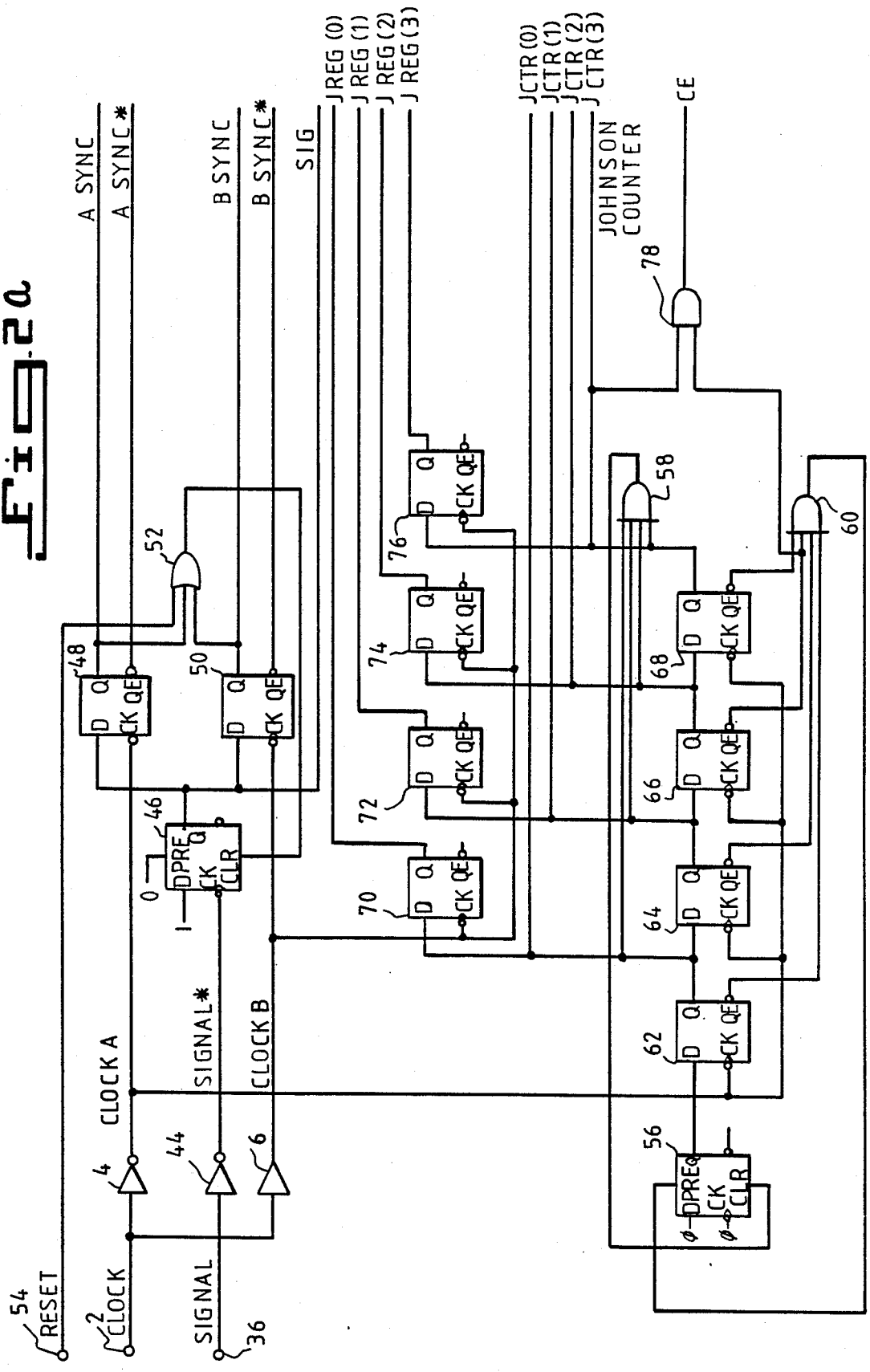
FIGS. 2a through 2e are schematic diagrams of interconnecting portions of a circuit formed in accordance with the present invention.

Initially referring to FIG. 2a, the input clock signal is provided to circuit input 2 and then to inverter 4 and noninverting buffer 6 to generate Clock A and Clock B, respectively, on the outputs of inverter 4 and buffer 6. Similarly, the input signal, indicating the occurrence of an event, is provided to input 36 and then to inverter 44. Clock A and Clock B and the output signal from inverter 44, which corresponds to the inverse of the input signal, are provided to the clock edge encoder comprising negative edge triggered D-type flip flops 46–50 (flip flops 48 and 40 could be edge triggered, D-type registers, as shown).

More specifically, the inverted input signal, SIGNAL*, is provided to the clock (CK) input of flip flop 46, whose D input is held at a logic "1" level. A negative edge of SIGNAL* will trigger flip flop 46, and its Q output will go to a logic "1" level. The Q output of flip flop 46 provides the signal labeled SIG in FIG. 2a, which will be used in generating the LATCH ENABLE signal. The Q output of flip flop 46 is connected to the D inputs of registers 48 and 50, whose clock (CK) inputs are respectively provided with the Clock A and Clock B signals. The Q output and QE (or $\overline{Q}$) output of register 48 will respectively provide the A SYNC signal and an A SYNC* signal (which is the inverse of the A SYNC signal). Similarly, the Q and QE outputs of register 50 will respectively provide the B SYNC signal and a B SYNC* signal (which is the inverse of the B SYNC signal).

The input signal is effectively latched by flip flop 46 at least until the first negative edge of Clock A or Clock B occurs. To facilitate an understanding of the invention, it is assumed that the negative edge of Clock A occurs after the first half cycle of the input clock signal, and that the negative edge of Clock B occurs after the second half cycle of the input clock signal. Accordingly, if the input signal is received during the first half cycle of the input clock signal, the negative edge of Clock A will trigger register 48 and cause its Q output, representing the A SYNC signal, to go to a logic "1" level.

The Q output of register 48 is provided as one of the inputs to a 3-input OR gate 52, whose output is connected to the clear (CLR) input of flip flop 46. Thus, as soon as the A SYNC signal is generated, flip flop 46 is cleared. Flip Flop 46 should clear and, consequently, its Q output should go to a "0" logic level, prior to the arrival of the negative edge of Clock B on the clock (CK) input of register 50 (which negative edge occurs at the end of the second half cycle of the input clock signal). Because the D input of register 50 is connected to the Q output of flip flop 46, which output has returned to a "0" logic level, the Q output of register 50 will remain at a low logic level when the negative edge of Clock B is received, and no B SYNC pulse signal is generated by flip flop 50.

It is possible that, due to the propagation delays of flip flops 46-50 and OR gate 52, and at high operating frequencies, a B SYNC pulse signal will be generated, as flip flop 46 might not return to a low logic level before Clock B's negative edge. In such a case, however, the B SYNC pulse signal will always be generated after and thus lag the A SYNC signal, and will not cause the wrong TOA data to be outputted by the circuit, as will be seen.

If the event occurs in the second half cycle of the input clock signal, flip flop 46 will be clocked to a "1" level on its Q output, and register 50 will have its Q output go high upon the negative edge of Clock B. Thus, a B SYNC signal is generated. The Q output of register 50 is provided to another one of the inputs of OR gate 52. A "1" logic level on the Q output of register 50 will thus clear flip flop 46, preventing register 48 from going to a high logic level on its Q output upon the arrival of the negative edge of Clock A.

Again, due to propagation delays, it is possible that an A SYNC signal may be generated, which signal lags B SYNC, due to flip flop 46 not clearing before the negative edge of the Clock A signal arrives at register 48. However, only the B SYNC signal will control the circuit, as will be seen.

A RESET signal is provided on input 54, which is connected to the third input of OR gate 52. Accordingly, a logic "1" RESET signal will clear flip flop 46 and initialize the circuit.

The 4 bit Johnson-type counter 8 comprises an edge triggered (negative) D-type flip flop 56, two 4-input AND gates 58, 60 and four D-type edge triggered (negative) registers (or flip flops) 62-68. The Q output of register 62 is connected to the D input of register 64, the Q output of register 64 is connected to the D input of register 66; and the Q output of register 66 is connected to the D input of register 68. The clock (CK) inputs of registers 62-68 are provided with the Clock A signal.

Flip flop 56 and AND gates 58, 60 provide the self-clearing feature of the Johnson counter. Each Q output of registers 62-8 is connected to one of four inputs of AND gate 58, whose output is connected to the clear (CLR) input of flip flop 56. Similarly, each QE (or $\overline{Q}$) output of registers 62-68 is connected to one of four inputs of AND gate 60, whose output is connected to the preset (PRE) input of flip flop 56. Flip flop 56 has its Q output connected to the D input of register 62, and the D and clock (CK) inputs of flip flop 56 are held at a "0" logic level. The self starting feature is ensured by the fact that regardless of the initial state of flip flop 56, either a 1 or 0 will be propagated in the Johnson counter. Thus, either AND gate 58 or 60 will activate and cause the proper sequence of the counter to be initiated. This arrangement also assures that the Johnson counter will self-restart in the event of a "glitch".

The Johnson counter operates in the following manner. When all Q outputs of registers 62-68 are at a "1" logic level, AND gate 58 will clear flip flop 56, causing its Q output to go to a "0" logic level. At the next negative edge of the Clock A signal, register 62 will change state on its Q output from a "1" to a "0" level. A subsequent negative edge of the Clock A signal will cause register 64 to change the state of its Q output from a "1" level to a "0" logic level. Registers 66, 68 will similarly change state with subsequent negative edges of Clock A, until all Q outputs of registers 62-68 are at logic "0" levels. Since the QE outputs of registers 62-68 are now at logic "1" levels and are connected to AND gate 60, flip flop 56 will be preset with a "1" logic level on its Q output. At subsequent edges of Clock A, registers 62-68 will consecutively change state back to a "0" level on their Q outputs. Accordingly, with each negative edge of Clock A, only one of registers 62-68 will change state.

The Q outputs of registers 62-68 provide four bits of count data, designated in FIG. 2a as J CTR(O), J CTR(1), J CTR(2) and J CTR(3) and comprising the four least significant bits of count data. This count data is not only provided to the second TOA register 24, which will be described in relation to FIG. 2d but is also provided to counter register 18, a portion of which is comprised of edge triggered (negative) D-type registers (or flip flops) 70-76. That is, the Q outputs of registers 62-68 are respectively connected to the D inputs of registers 70-76. The clock (CK) inputs of registers 70-76 are provided with the Clock B signal. Accordingly, the count data of the Q outputs of registers 62-68 generated at the negative edge of Clock A are loaded into registers 70-76, respectively, on the subsequent negative edge of Clock B.

Registers 70-76 provide on their Q outputs a portion of the first register data, this portion being designated in FIG. 2A as J REG(0), J REG(1), J REG(2), and J REG(3) and comprising the four least significant bits of the first register data.

The Johnson counter further includes a two input AND gate 78, whose inputs are connected to the QE output of register 66 and the Q output of register 68. The output of the AND gate 78 provides a CARRY ENABLE (or CE) signal to binary counter 10, which will be described in relation to FIG. 2b. The CE signal enables the binary counter just prior to the final count on the Johnson counter. Thus, if the count data generated by registers 62-68 is 0,0 0,1, respectively, the CE signal will be at a logic "1" level to enable the binary counter 10 to begin counting on the next negative edge of Clock A.

Figure 2B:
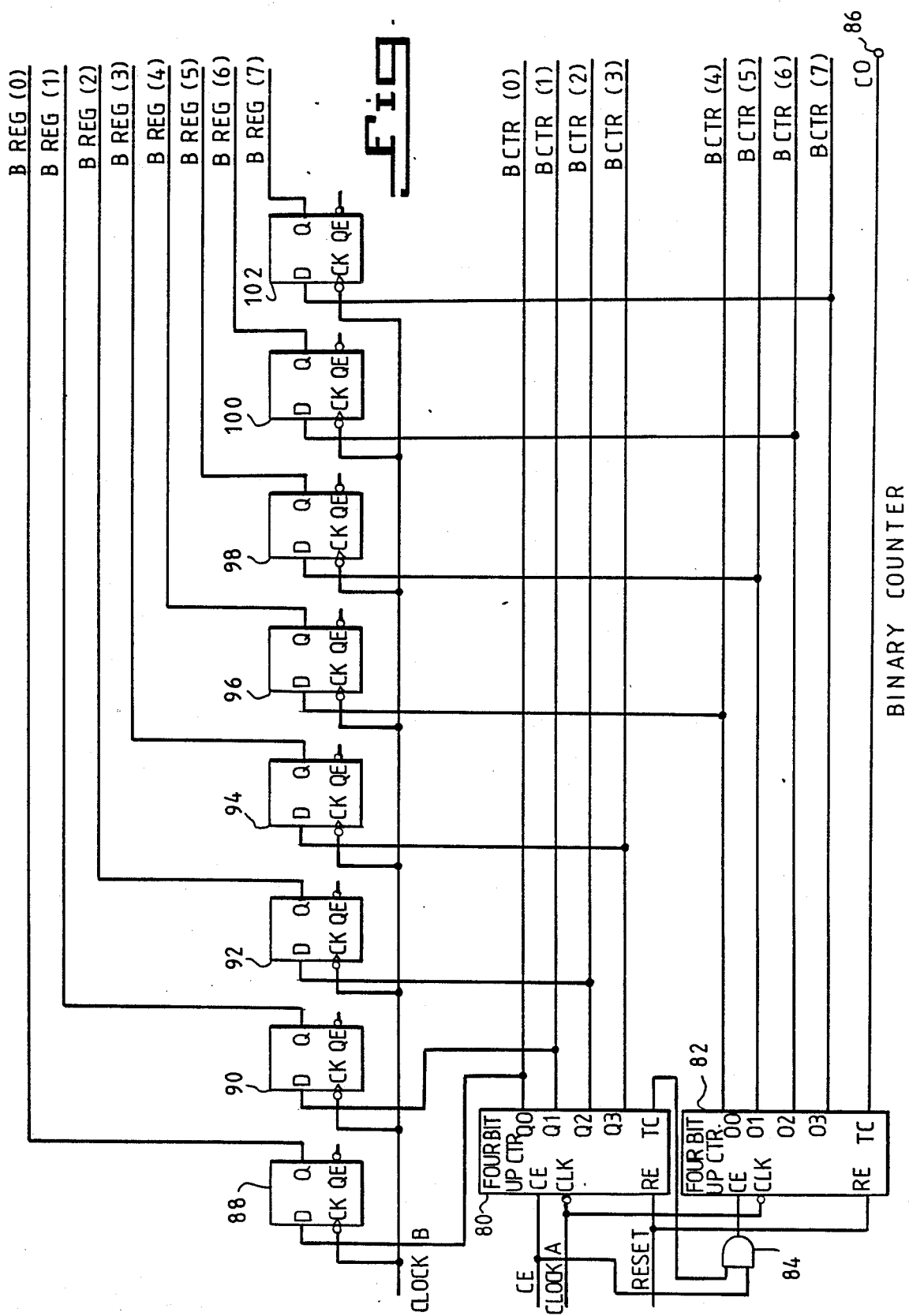

Referring now to FIG. 2b a preferred form of binary counter 10 and that portion of counter register 18 which stores the count data generated by binary counter 10 will be described.

Counter 10 is comprised of a pair of 4 bit binary "up" counters 80, 82, each having its clock (CLK) input provided with the Clock A signal, as described in relation to registers 62 & 68. Counter 80 has four outputs, Q0-Q3, which outputs respectively provide the next four more significant bits of count data, designated in FIG. 2a as B CTR (0) through B CTR (3), after the four bits provided by registers 62-68. Counter 82 also has four outputs, Q0-Q3, which outputs respectively provide the four most significant bits of count data, designated B CTR (4) through B CTR (7).

The CE signal generated by AND gate 78 is provided to the clock enable (CE) input of counter 80. The terminal count (TC) output of counter 80 is connected to one input of a two input AND gate 84, on whose other input is provided the CE signal. The output of the AND gate 84 is connected to the clock enable (CE) input of counter 82. Connected together in this manner, counters 80, 82 will count up in binary through the 8 most significant bits of count data. The terminal count (TC) output of counter 82 will provide a CARRY OUTPUT (CO) signal to circuit output 86 for connection to a counter of an external circuit, if a greater number of count data bits is desired, for example. The reset (RE) inputs of counters 80, 82 are electrically connected to input 54 so that they may be provided with the RESET signal to initialize their count data to all logic "0" levels.

As with the count data provided by registers 62-68, the count data provided by counters 80,82 are stored in a series of D-type, negative edge-triggered registers (or flip flops) 88-102. More specifically, the D input of each of registers 88-102 are connected to the Q0-Q3 outputs of counters 80,82, respectively. The clock (CK) inputs of registers 88-102 are provided with the Clock B signal in the same manner as registers 70-76, so that the count data generated by counters 80,82 will be loaded into registers 88-102 at the end of the second half cycle of the input clock signal.

The Q outputs of registers 88-102 provide the remaining 8 bits of counter register data representing the count data stored in counter register 18, which counter register data is also referred to as the first register data. The first register data provided by the Q outputs of registers 88-102 are labeled in FIG. 2b as B REG (0) through B REG (7).

Figure 2C:
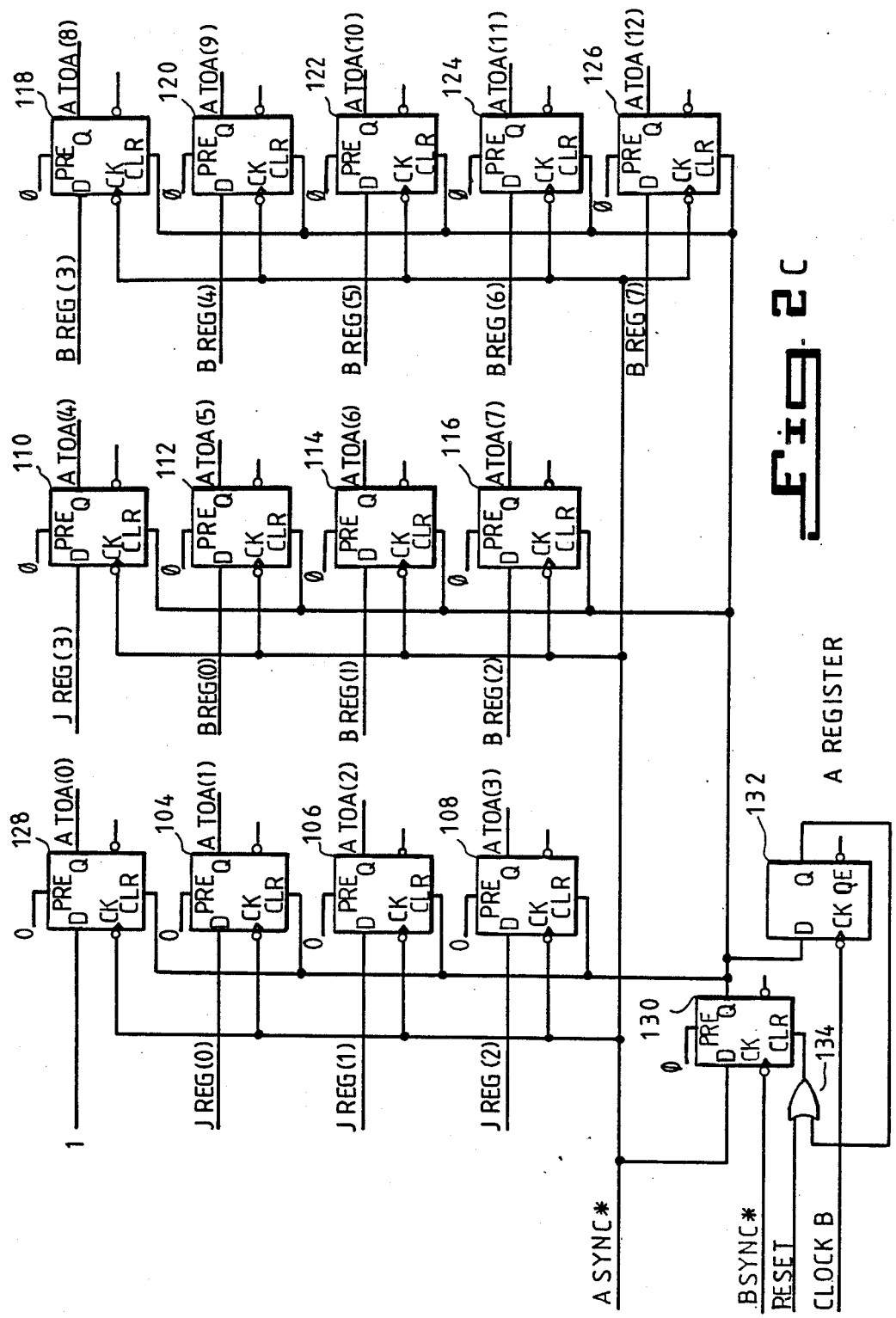
Figure 2D:
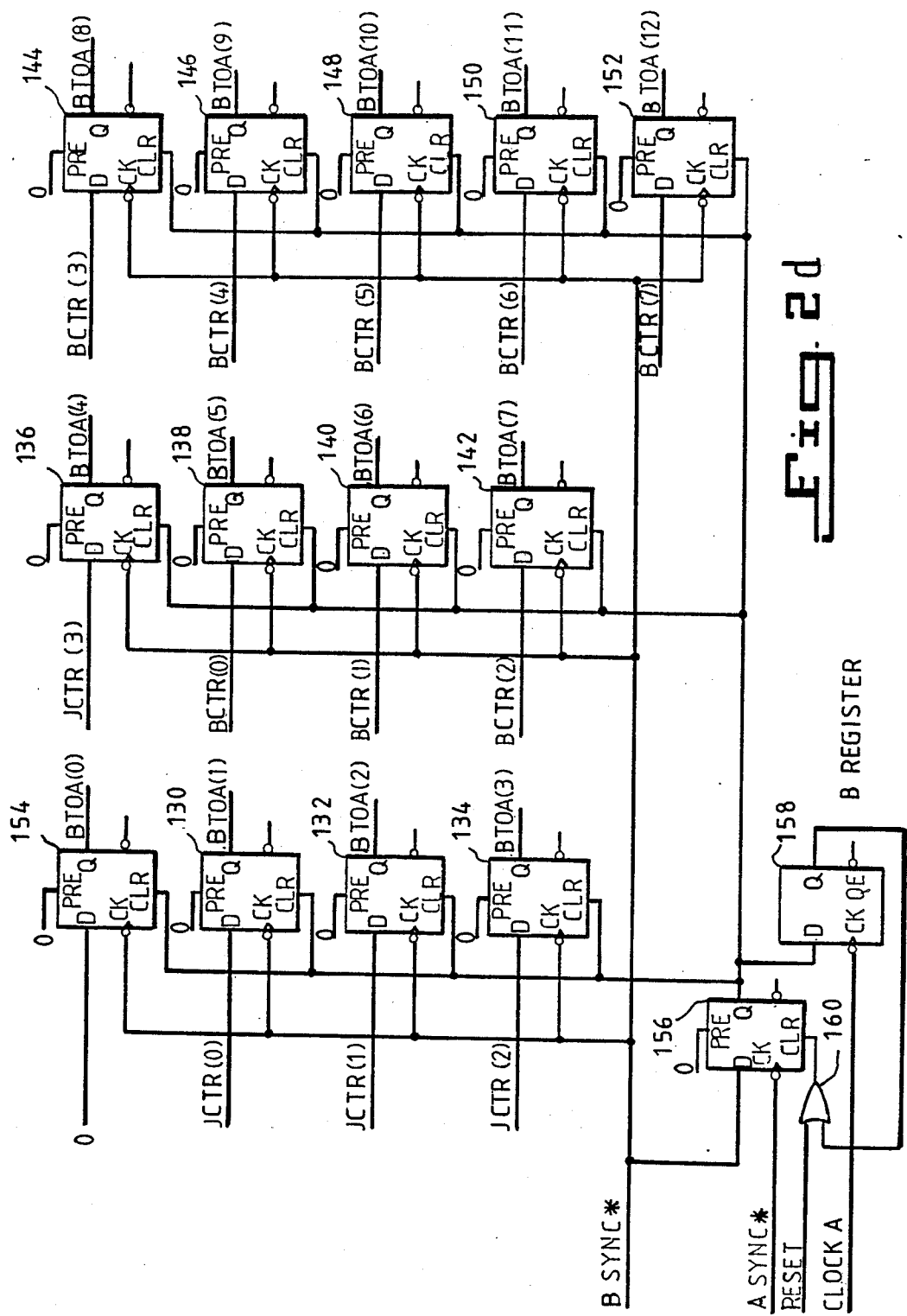

FIGS. 2c and 2d show a preferred embodiment of the first TOA register 22 and the second TOA register 24, respectively. As shown in FIG. 2c the first register data (i.e., the count data stored in counter register 18) labeled J REG (0) through J REG (3) and B REG (0) through B REG (7) generated by registers 70-76 and 88-102 are provided to the D inputs of a series of D-type, negative edge triggered flip flops 104-126, respectively. Flip flips 104-126 will store the first register data. An additional flip flop 128 is provided as part of the first TOA register 22, which flip flop has its D input provided with a logic "1" level. Each clock (CK) input of flip flops 104-128 are provided with the A SYNC* signal generated by register 48 so that, upon the negative edge of the A SYNC* signal, the first register data will be loaded into flip flops 104-126, and a "1" will be loaded into flip flop 128.

The Q outputs of flip flops 128 and 104-126 provide the 13 bit first TOA data, respectively labelled in FIG. 2c as A TOA (0) through A TOA (12).

To control whether flip flops 104-128 should be cleared in the event that a B SYNC signal is generated, and the first TOA register 22 should not be read out, flip flop 130, register 132, both of which are D-type, negative edge triggered, and OR gate 134 are provided. Flip flop 130 has its D input connected to the A SYNC* signal generated on the QE output of register 48, and has its clock (CK) input provided with the B SYNC* signal generated on the QE output of register 50. The Q output of flip flop 130 is connected to the D input of register 132 and to the clear (CLR) inputs of flip flops 104-128. The Q output of register 132 is connected to one input of a 2 input OR gate 134, whose output is connected to the clear (CLR) input of flip flop 130. The other input of OR gate 134 is provided with the RESET signal, and the preset (PRE) input of flip flop 130 is provided with a "0" logic level, as are the preset (PRE) inputs of flip flops 104-128.

When the A SYNC signal is generated by register 48, the A SYNC* signal will go to a low logic level, which transition will cause the first register data to be loaded into flip flops 104-126, and a logic "1" level to be loaded into flip flop 128. We are assuming beforehand that a high level pulse on the RESET signal provided to OR gate 134 will clear flip flop 130 so that its Q output will be at a logic "0" level, and that all clear (CLR) inputs of registers 104-128 have returned to a "0" logic level so that they are free to load in the data.

If the event occurs in the second half of the input clock signal, so that a B SYNC signal is generated by register 50, the data in flip flops 104-128 of the first TOA register 22 is not to be read out. Accordingly, with the generation of a B SYNC signal, a B SYNC* signal will also be generated, and its negative edge will load into flip flops 130 the logic level of the A SYNC* signal on the D input of flip flop 130. The A SYNC* signal will be at a high logic level so that the Q output of flip flop 130 will go to a "1" logic level. This will cause registers 104-128 to clear so that their Q outputs will be at a "0" logic level. The clock (CK) input of register 132 is provided with the clock B signal and, upon a negative transition of the Clock B signal (which occurs after the second half of the input clock signal), the Q output of register 132 will go to a "1" logic level which, through OR gate 134, will clear flip flop 130 so that its Q output will now go to a low logic level. The low logic level of the Q output of flip flop 130 will now be loaded into register 132 with the next negative edge of the clock B signal so that the clear (CLR) input of flip flop 130 will return to its normal logic "0" state.

An embodiment of the second TOA register 24 is shown in FIG. 2d. As can be seen from a comparison of FIGS. 2c and 2d, the second TOA register 24 is structured and functions similarly to the first TOA register 22 shown in FIG. 2c.

The second TOA register 24 includes negative edge triggered D-type flip flops 130-152, which are respectively provided on their D inputs with count data J CTR (0) through J CTR (3) and B CTR (0) through B CTR (7). Another D-type, negative edge triggered flip flop 154 is provided, and a "0" logic level is provided on its D input. The Q outputs of flip flops 154 and 130-152 respectively provide the second TOA data, designated in FIG. 2d as B TOA (0) through B TOA (12). Again, the second TOA data comprises 13 bits.

Each of the clock (CK) inputs of flip flops 130-154 is provided with a B SYNC* signal generated by register 50, so that the count data from Johnson counter 8 and binary counter 10 will be loaded into flip flops 130-152, and a "0" logic level will be loaded into flip flop 154, on the negative edge of the B SYNC* signal.

The second TOA register 24 further includes a D-type, negative edge triggered flip flop 156, a D-type, negative edge triggered register 158 and a 2 input OR gate 160, all of which are connected together in the same manner as flip flop 130, register 132 and OR gate 134 of the first TOA register 22, except that the clock (CK) input of flip flop 156 is provided with the A SYNC* signal, the D input of flip flop 156 is provided with the B SYNC* signal, and the clock (CK) input of register 158 is provided with the Clock A signal. The preset (PRE) inputs of flip flops 130–156 are also provided with a "0" logic level.

The second TOA register 24 is initialized with a high level RESET pulse on one of the inputs of OR gate 160, which will clear flip flop 156 so that its Q output will be at a low level and, upon a negative edge of the Clock A signal, the Q output of register 158 will also go to a low level. The clear (CLR) input of flip flop 156 will return to a low level when the RESET signal returns to its normal low level.

When a B SYNC signal is generated by the clock edge encoder 34, the B SYNC* signal will go to a "0" logic level, which transition will load the count data from registers 62–68 and counters 80,82 into flip flops 130–152 and a "0" logic level will be loaded into flip flop 154. Should the event occur in the first half cycle of the input clock signal such that the A SYNC signal will be generated, the B SYNC* signal will be at a "1" logic level and at the D input of flip flop 156, this logic level being loaded into flip flop 156 with the negative edge of the A SYNC* signal provided to flip flop 156. The Q output of flip flop 156 will go to a "1" logic level, which will clear flip flops 130–154 so that the second TOA data on the Q outputs of these flip flops will go to a "0" logic level.

As mentioned previously, it may be possible for an A SYNC signal and a B SYNC signal to be generated when the event occurs during the first half cycle of the clock signal. In such a situation, the A SYNC signal will always lead the B SYNC signal. The A SYNC* signal on the D input of flip flop 130 will be at a low logic level when the B SYNC* signal on the clock (CK) input of flip flop 130 goes to a low level. Accordingly, the Q output of flip flop 130 will remain at a "0" logic level and will not clear registers 104–128.

The inadvertently generated B SYNC signal will also not cause the second TOA register 24 to load in new count data. This is because the A SYNC signal, which precedes the B SYNC signal, has caused the second TOA register 24 to clear, and the Q output of flip flop 156 remains at a "1" level during the negative edge of B SYNC* provided to the clock (CK) inputs of flip flops 130–154.

Similarly, if the event occurs during the second half cycle of the input clock signal and both B SYNC and A SYNC are generated, with B SYNC leading A SYNC, the B SYNC signal will control the circuit. The B SYNC* signal on the D input of flip flop 156 will be low when the negative edge of A SYNC* arrives, and the Q output of flip flop 156 will stay at a low level, allowing flip flops 130–154 to function. Also, the flip flops of the first TOA register 22 will remain cleared when the negative edge of the A SYNC* signal arrives at the clock (CK) inputs of flip flops 104–128.

Figure 2E:
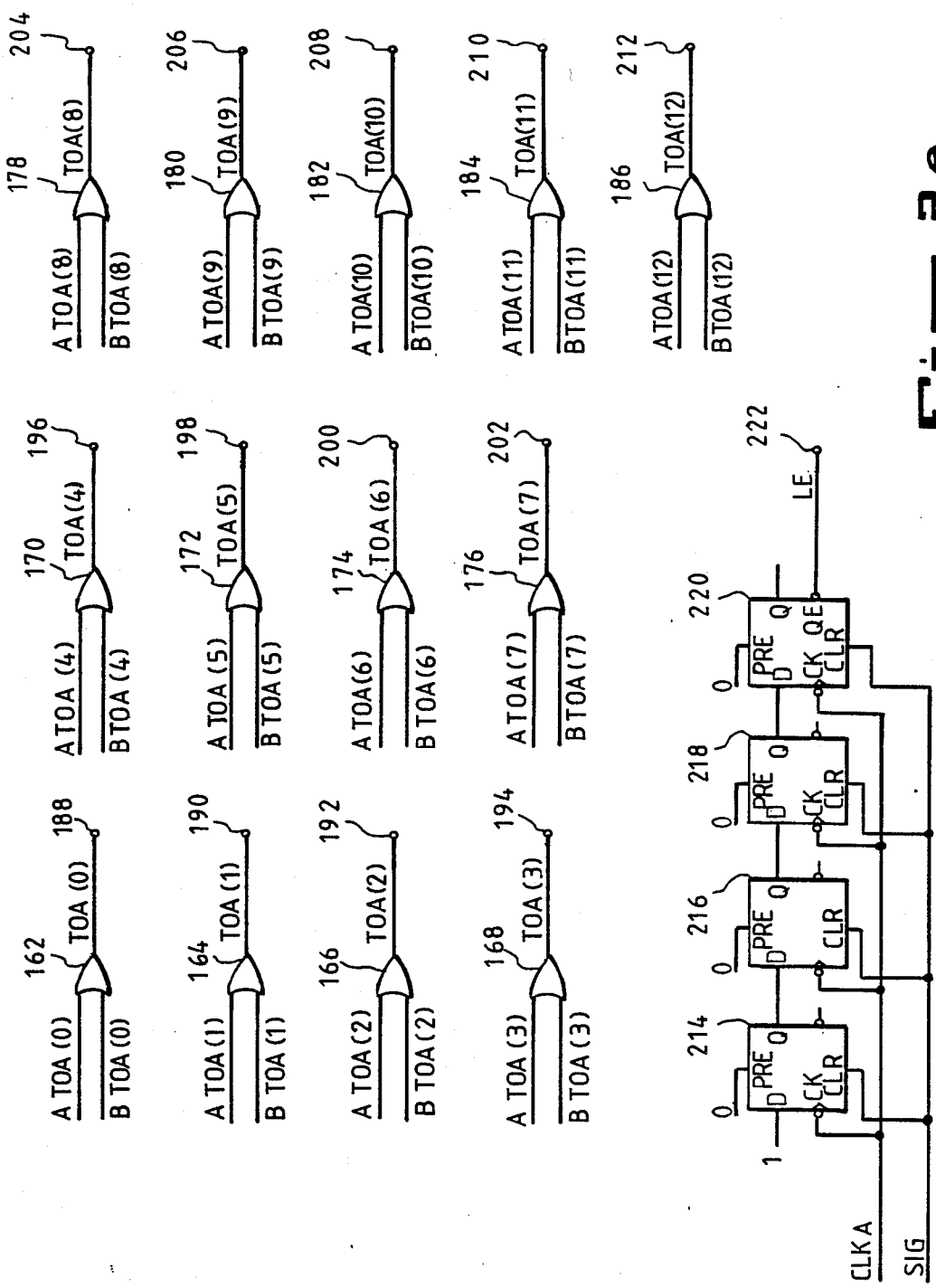

Turning now to FIG. 2e of the drawings, it will be seen that the OR gate 30 shown in FIG. 1 actually comprises 13 two input OR gates 162–186. Each of the OR gates 162–186 is provided with the same weight bit of the first and second TOA data. More specifically, the data labelled A TOA (0) through A TOA (12) are provided to one input of OR gates 162 through 186, and the data B TOA (0) through B TOA (12) are provided on the other input of OR gates 162–186, respectively. The outputs of OR gates 162–186 respectively provide the time of arrival data, designated in FIG. 2e as TOA (0) through TOA (12), to the circuit outputs 188–212, respectively.

If FIGS. 2c through 2e are viewed in combination, it will be seen that an event occurring in the first half cycle of the input clock signal will cause the A SYNC signal to be generated, causing the first TOA data to be provided to OR gates 162–186 and causing flip flops 130–154 of the second TOA register 24 to be cleared such that the second TOA data provided to OR gates 162–186 will all be at a "0" logic level. Thus, the second TOA data will not interfere with or block the first TOA data at OR gates 162 through 186 and so that the first TOA data will be outputted by the circuit on outputs 188–212.

Similarly, if the event occurs in the second half of the input clock signal, the B SYNC signal is generated which will case the second TOA register 24 to provide the second TOA data to OR gates 162–186 and which will cause flip flops 104–128 of the first TOA register 22 to clear so that the first TOA data will all appear as a "0" logic level at OR gates 162–186. This will allow the second TOA data at OR gates 162–186 to pass to the outputs 188–212 as the proper TOA data to be read.

FIG. 2e also shows a portion of the clock edge encoder 34 which generates the LATCH ENABLE (LE) signal to be generated. The portion of the clock edge encoder 34 which generates the LE signal is preferably comprised of a series of D-type, negative edge triggered flip flops 214–220. Four flip flops are shown in FIG. 2e although a greater or fewer number may be used depending upon the propagation delay of the circuit from the generation of the SIG signal to when the TOA data is available at the circuit outputs 188–212 to be read.

The SIG signal is provided to the clear (CLR) inputs of flip flops 214–220, and the clock (CK) inputs of the same flip flops are provided with the clock A signal. The preset (PRE) inputs of the flip flops are provided with a "0" logic level.

Flip flop 214 is provided with a "1" logic level on its D input. Its Q output is connected to the D input of flip flop 216, whose Q output is in turn connected to the D input of flip flop 218, again whose Q output is connected to the D input of flip flop 220. Flip flop 220 has its QE (or $\bar{Q}$) output providing the LE signal on circuit output 222.

When an event occurs, the SIG signal will go to a "1" logic level, clearing registers 214–220. The SIG signal will return to a low logic level, allowing registers 214–220 to operate, upon occurrence of the negative edge of Clock A or Clock B, depending upon during which half cycle the event occurred. Due to propagation delays, the SIG signal will return to a low level prior to the arrival of the negative edge of Clock A, thus enabling registers 214–220.

At a negative edge of the clock A signal, a "1" logic level will be loaded into flip flop 214, so that its Q output will go to a "1" logic level. Similarly, flip flop 216 will go to a "1" logic level at its Q output on the next negative edge of the clock A signal. On the third and then the fourth negative edges of the clock A signal, flip flop 218 will go to a high level at its Q output and flip flop 220 will go to a low level at its QE output. This low logic level is provided as the LE signal on circuit output 222. Accordingly, a LATCH ENABLE signal may be generated after a predetermined number of cycles of the clock A signal.

FIG. 3 shows, in a simplified form, a timing diagram for the event occurrence time counter shown in FIGS. 2a-2e.

Referring first to FIG. 3a, the input clock signal provided on input 2 of the circuit is shown. To facilitate an understanding of the invention, all timing is referenced to $t_o$. Furthermore, the first half cycle of the input clock signal is designated in FIG. 3a by an A, and the second half cycle is designated by a B. Also, a high logic level is shown by parallel diagonal lines under the area of the signal.

FIG. 3b shows the clock A signal. The negative edge of the clock A signal occurs at the end of the first half cycle A.

FIG. 3c shows the clock B signal. The negative edge of the clock B signal occurs at the end of the second half cycle B of the input clock signal.

It is assumed, for purposes of explanation, that an input signal (i.e., SIGNAL) on input 36 occurs during the first half cycle A of the input clock signal, as shown in FIG. 3d. Consequently, its inverse (i.e., SIGNAL*) at the clock (CK) input of flip flop 46 of the clock edge encoder 34 is shown in FIG. 3e. The negative edge of the inverted input signal (FIG. 3e) causes the SIG signal to be generated, as shown in FIG. 3f. At the next negative edge of the clock A signal, the A SYNC signal will be generated, as shown in FIG. 3g. Generation of the A SYNC signal will cause flip flop 46 to clear, causing the SIG signal to return to a low logic level. If the event occurred during the second half cycle B of the input clock signal, a B SYNC signal would have been generated, as shown in FIG. 3h.

The count data generated by counters 8, 10 is illustrated by FIG. 3i, which shows that the data changes on the negative edge of the clock A signal. The count data is loaded into the counter register 18 on the negative edge of the clock B signal. Thus, FIG. 3j shows the first register data changing to a "1" logic level, to reflect the count data shown in FIG. 3i which is loaded into the counter register 18.

The first register data (i.e., the stored count data) of the counter register 18 is loaded into the first TOA register 22 on the negative edge of the A SYNC* signal (or the positive edge of the A SYNC signal shown in FIG. 3g). At that time ($t_1$) the first register data is at a low logic level (FIG. 3j). Accordingly, FIG. 3k shows the first TOA data at time $t_1$ changing to a low logic level.

FIG. 3l shows the Q output of flip flop 156 shown in FIG. 2d. This signal is provided to the clear (CLR) inputs of flip flops 130-154 of the second TOA register 24. Accordingly, the high logic level will clear these registers, and the second TOA data will go to a low logic level, as illustrated by FIG. 3 m. Thus, the second TOA data, which is not selected for outputting by the event occurrence time counter, will not inhibit the transfer of the first TOA data through OR gates 162-186. Accordingly, the TOA data on circuit outputs 188-212 will be the first TOA data, as shown in FIG. 3n.

The event occurrence time counter of the present invention is perfectly adaptable for use at extremely high frequencies, such as 2 Gigahertz. The time of arrival data which is provided by the counter is unambiguous, as only data which is stable is selected.

The event occurrence time counter of the present invention can also determine during which half cycle of the input clock the event occurred. This information is provided as the least significant bit of the time of arrival data outputted by the circuit, for example, a "1" signifying the event occurred in the first half cycle, and a "0" indicating that it occurred in the second half cycle. Thus, the resolution provided by the counter is 0.5 of the period of the input clock which, when operating at 2 Gigahertz, can be as low as 250 pico seconds.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A high resolution event occurrence time counter, which comprises:

free running counter means, the counter means being responsive to a clock signal and providing count data which varies in response to the clock signal, the clock signal being periodic, each period of the clock signal having a first half period and a second half period;

first register means for storing the count data of the free running counter means, the first register means being responsive to the clock signal and storing the count data in response thereto, the first register means providing first register data representative of the count data stored therein;

second register means for storing the first register data of the first register means, the second register means providing first time of arrival data representative of the first register data stored therein;

third register means for storing the count data of the free running counter, the third register means providing second time of arrival data representative of the count data stored therein;

clock edge encoder means for determining whether an event occurred during one of the first half period and the second half period of the clock signal, the clock edge encoder means providing a first sync signal when the event occurred during the first half period, and a second sync signal when the event occurred during the second half period;

the second register means being responsive to the first sync signal and storing the first register data in response thereto;

the third register means being responsive to the second sync signal and storing the count data in response thereto;

wherein at least the first time of arrival data is provided as output data of the event occurrence time counter when at least the first sync signal is provided by the clock edge encoder means, and at least the second time of arrival data is provided as output data when at least the second sync signal is provided by the clock edge encoder means.

2. A high resolution event occurrence time counter as defined by claim 1, wherein the free running counter means includes a Johnson-type counter and a binary counter coupled together in series.

3. A high resolution event occurrence time counter as defined by claim 1, wherein the second register means are cleared of first register data in response to the second sync signal provided by the clock edge encoder means, and the third register means are cleared of count data in response to the first sync signal provided by the clock edge encoder means, whereby only one of the first time of arrival data and the second time of arrival data will be provided as output data of the event occurrence time counter.

4. A high resolution event occurrence time counter, as defined by claim 3, which further comprises OR means for logic or'ing together the first time of arrival data and the second time of arrival data, the OR means providing output data corresponding to one of the first and second time of arrival data.

5. A high resolution event occurrence time counter, as defined by claim 1, wherein the output data of the event occurrence time counter includes a least significant bit having a first logic state if at least the first sync signal is provided by the clock edge encoder means, and having a second logic state if at least the second sync signal is provided by the clock edge encoder means.

6. A high resolution event occurrence time counter, as defined by claim 1, wherein the clock edge encoder means further includes means for indicating when output data of the event occurrence time counter is available, the output data indicating means counting a predetermined number of periods of the clock signal after the event has occurred and providing a signal indicating that output data of the event occurrence time counter is available to be provided to an external circuit.

7. A high resolution event occurrence time counter, as defined by claim 1, wherein the counter means provides a carry signal, the carry signal being provided as an output of the event occurrence time counter so as to be available to be provided to an external counter.

* * * * *